United States Patent
Huang et al.

(10) Patent No.: US 6,713,321 B2
(45) Date of Patent: Mar. 30, 2004

(54) SUPER LOW PROFILE PACKAGE WITH HIGH EFFICIENCY OF HEAT DISSIPATION

(75) Inventors: Chien-Ping Huang, Hsinchu (TW); Tzong-Dar Her, Taichung (TW)

(73) Assignee: Siliconware Precision Industries Co. Ltd., Taichung (TW)

(*) Notice: Subject to any disclaimer, the term of this patent is extended or adjusted under 35 U.S.C. 154(b) by 0 days.

(21) Appl. No.: 10/305,965

(22) Filed: Nov. 29, 2002

(65) Prior Publication Data

US 2003/0092221 A1 May 15, 2003

Related U.S. Application Data (62) Division of application No. 09/894,884, filed on Jun. 29, 2001, now Pat. No. 6,541,854.

(30) Foreign Application Priority Data

Dec. 1, 2000 (TW) ......................................... 89125656 A (51) Int. Cl.⁷ .............................. H01L 21/48; H05K 3/30
(52) U.S. Cl. ...................... 438/122; 438/124; 438/127; 29/841; 29/855
(58) Field of Search .................................. 257/678, 684, 257/687, 701, 706, 707, 712, 713, 717, 720, 734, 737, 738, 773, 774, 779, 780, 787, 796; 438/106, 110, 112, 121, 122–127, 369–371

(56) References Cited

U.S. PATENT DOCUMENTS

| | | | | |
|---|---|---|---|---|
| 5,397,917 A | * | 3/1995 | Ommen et al. | 257/698 |
| 5,438,478 A | * | 8/1995 | Kondo et al. | 361/704 |
| 5,596,485 A | * | 1/1997 | Glenn et al. | 361/703 |
| 5,977,626 A | * | 11/1999 | Wang et al. | 257/707 |
| 6,060,778 A | * | 5/2000 | Jeong et al. | 257/710 |
| 6,160,705 A | * | 12/2000 | Stearns et al. | 361/704 |
| 6,184,580 B1 | * | 2/2001 | Lin | 257/712 |
| 6,541,854 B2 | * | 4/2003 | Huang et al. | 257/707 |

* cited by examiner

Primary Examiner—Alonzo Chambliss
(74) Attorney, Agent, or Firm—Rabin & Berdo, P.C.

(57) ABSTRACT

A super low profile package with high efficiency of heat dissipation comprises the substrate, the heat sink, the die, the wires and the plastic mold. The heat sink adheres to the ground ring by the extending part of the heat sink, and the first surface of the die adheres to the heat sink. In addition, the die is connected to the substrate by the wires, and the plastic mold encapsulates the die, the heat sink and the wires. The chip package according to the invention possesses the small size and high efficiency of heat dissipation; besides, it also decreases the production cost for eliminating the conventional procedures of taping and de-taping.

4 Claims, 9 Drawing Sheets

SUPER LOW PROFILE PACKAGE WITH HIGH EFFICIENCY OF HEAT DISSIPATION

This Application is a Divisional Application of U.S. application Ser. No. 09/894,884, filed Jun. 29, 2001 now U.S. Pat. No. 6,541,854.

BACKGROUND OF THE INVENTION

1. Field of the Invention

The invention relates in general to a chip package, and more particularly to a super low profile package with high efficiency of heat dissipation.

2. Description of the Related Art

Recently, a trend of increasing the number of input/output (I/O) lead has developed so that the size of a chip package is increased after mounting a die in the packaging process; therefore, it is important to minimize the size of the package and the thickness of the plastic mold in order to reduce the overall size of the chip package.

Figure 1A:
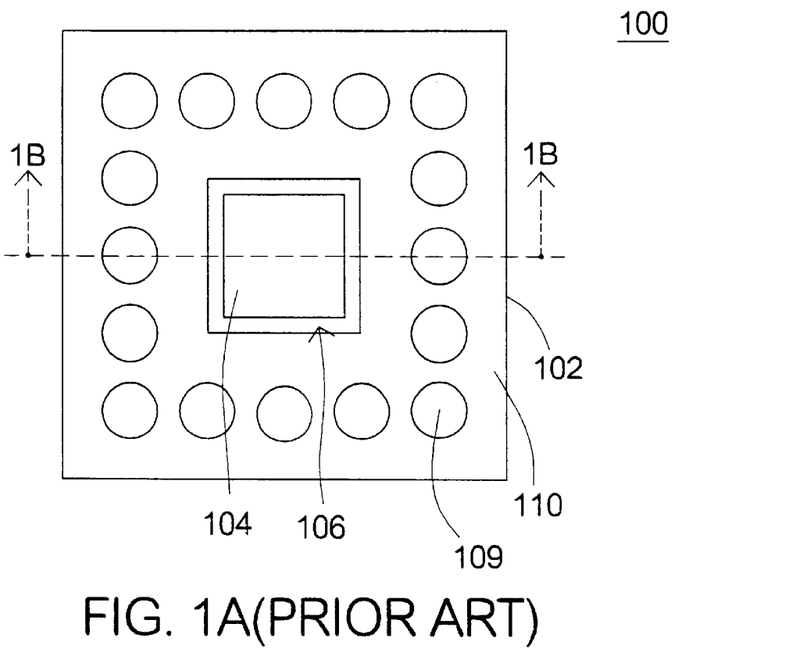
FIG. 1A (Prior Art) shows an upward view of the conventional chip package.

A method for reducing the package size of a chip package invented by Barry M. Miles and Glenn E. Gold is disclosed in U.S. Pat. No. 5,696,666. Referring to FIG. 1A, which depicts an upward view of the conventional chip package 100, the chip package 100 includes the substrate 102 and the die 104. The die 104 is seated in the cavity 106 that is located in the center of the substrate 102, and a number of the solder balls 109 are seated on the bottom side 110 of the substrate 102.

Figure 1B:
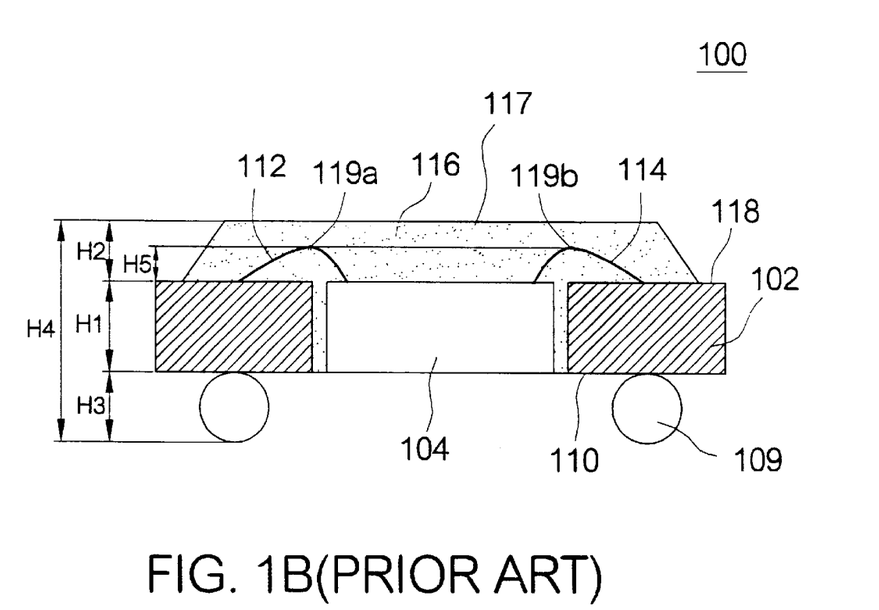
FIG. 1B (Prior Art) shows a cross sectional view of the chip package along the sectional line 1B—1B in FIG. 1A.

FIG. 1B depicts a cross-sectional view of the chip package along the sectional line 1B—1B in FIG. 1A. In FIG. 1B, the die 104 is wire-bonded to the substrate 102 via the wires 112 and 114, and the plastic mold 116 is applied on the topside 118 of the substrate 102; hence, the die 104 and the wires 112, 114 are encapsulated in the plastic mold 116. The topside 118 of the substrate 102 is opposite the bottom side 110 of the substrate 102. H1 and H4 represent the thickness of the substrate 102 and the chip package 100, respectively. H2 represents the distance from the topside 117 of the plastic mold 116 to the topside 118 of the substrate 102, the minimal value of which is approximately 0.2 mm. H3 represents the height of the solder balls 109, the minimal value of which is approximately 0.3 mm. The thickness of the die 104 is equal to, or thinner than, the substrate 102. H5 represents the distance from the highest point of the wire 119a/119b to the topside 118 of the substrate 102, and the minimal value is approximately 0.15 mm that is smaller than H2. Therefore, the overall thickness H4 of the conventional chip package is equal to the sum of H1, H2 and H3, wherein the minimal overall thickness H4 is approximately 0.7 mm.

Figure 2A:
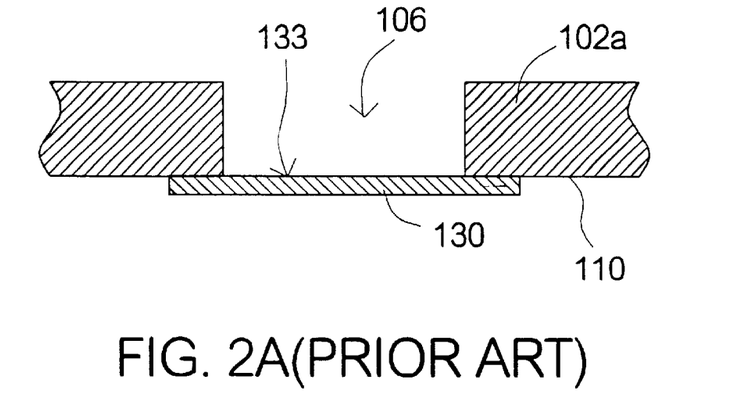
FIGS. 2A~2D (Prior Art) show the process of making the conventional chip package illustrated in FIGS. 1A~1B.

FIGS. 2A, 2B, 2C and 2D depict the process of making the conventional chip package illustrated in FIGS. 1A and 1B. Referring to FIG. 2A, the cavity 106 is formed in the substrate 102a, and the tape then is adhered on the bottom side 110 of the substrate 102a to seal the opening 133 below the cavity 106.

Figure 2B:
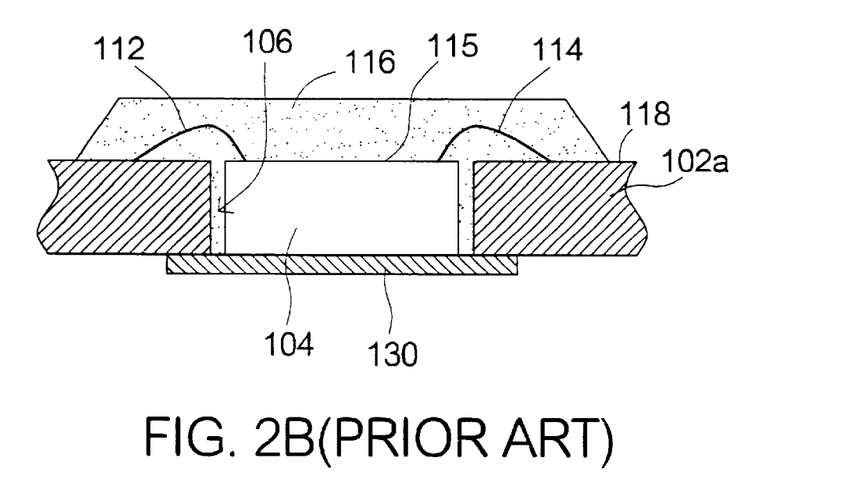

Referring to FIG. 2B, the die 104 is seated in the cavity 106 and held with the tape 130, wherein the front surface 115 of the die 104 is toward to the same direction as the topside 118 of the substrate 102a. The die 104 is then wire-bonded using conventional techniques, and the die 104 and the substrate 102a is electrically connected by the wires 112, 114 on the front side 115 of the die 104. Encapsulation subsequently proceeds; the die 104 is filled with the plastic mold 116 to a predetermined level. The plastic mold 116 that encapsulates the die 104, wire 112 and wire 114 provides strong mechanical support for the die 104 in order to stabilize the die 104 in the substrate 102a.

Figure 2C:
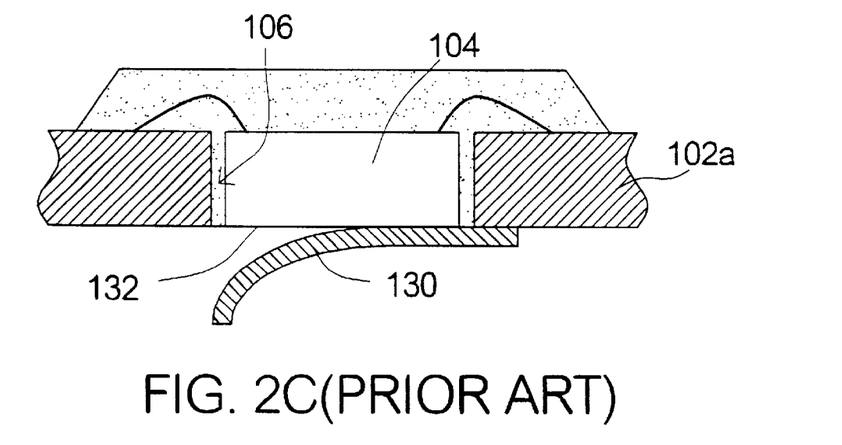

After the die 104 is fixed to the substrate 102a by the plastic mold 116, the tape 130 is not needed; therefore, de-taping is then proceeding as shown in FIG. 2C, resulting in the bottom side 132 of the die 104 is exposed to the atmosphere.

Figure 2D:
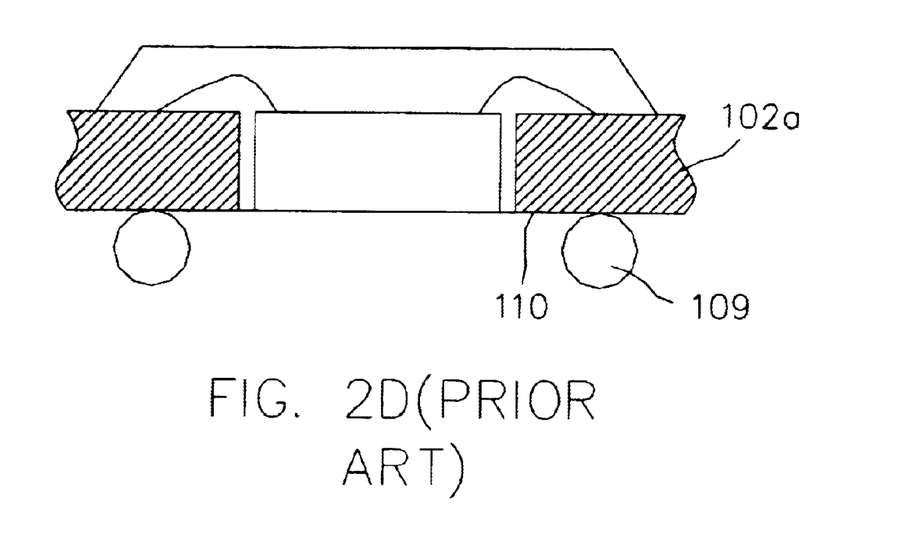

Subsequently, solder ball placement proceeds, wherein the numerous solder balls 109 are seated on the bottom side 110 of the substrate 102a as shown in FIG. 2D. After singulation, the conventional chip package 100 is obtained as presented in FIG. 1B.

Figure 3:
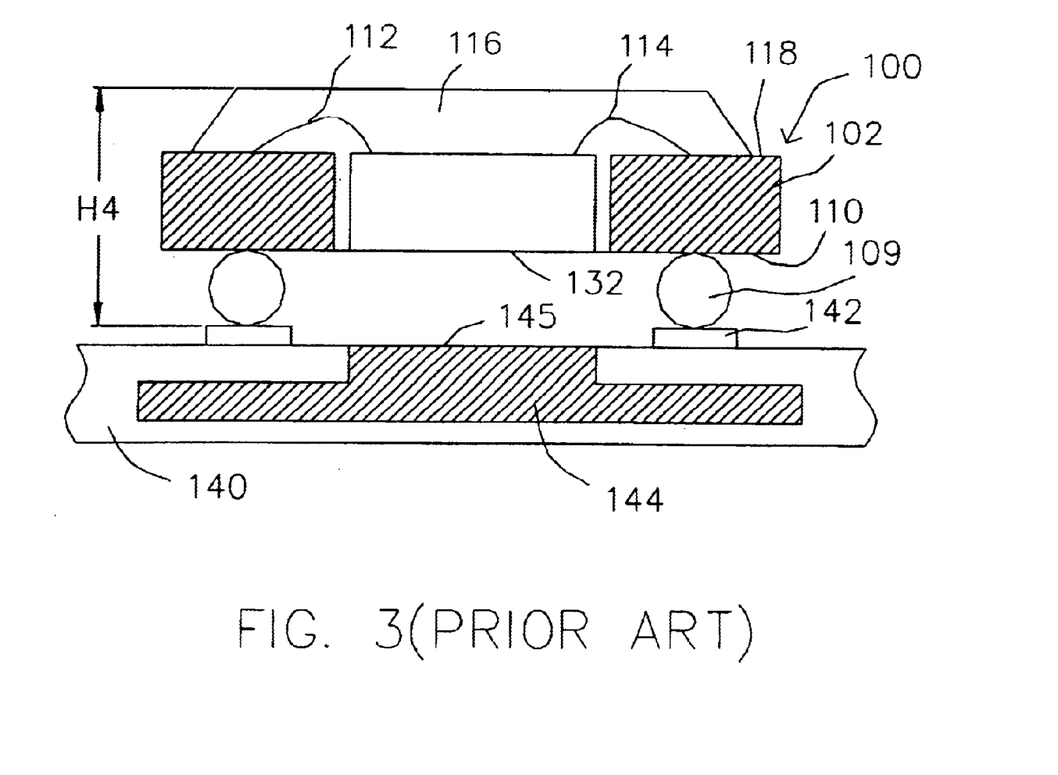
FIG. 3 (Prior Art) shows a side view of the chip package in FIG. 1B which have been connected to the printed circuit board (PCB)

Referring to FIG. 3, which depicts a side view of the chip package in FIG. 1B while connected to the printed circuit board (PCB) 140. In FIG. 3, the chip package 100 is fixed to the PCB 140 by connecting the solder balls 109 to the bonding pads 142, resulting in the chip package 100 electrically connected to the PCB 140. The plastic mold 116, the wires 112 and 114 are seated on the topside 118 of the substrate 102 while the bottom side 132 of the die 104 is exposed to the atmosphere. However, the bottom side 132 of the die 104 is not connected with the surface 145 of the ground layer 144 by soldering so that heat generated by the die, which must typically be drawn from the chip through package interconnects, can not be efficiently dissipated to the outside or the atmosphere by the ground layer 144 of PCB 140.

Moreover, the plastic mold 116 and the wires 112, 114 are seated on the topside 118 of the substrate 102, and the solder balls 109 are seated on the bottom side 110 of the substrate 102; therefore, the overall thickness H4 of the conventional chip package 100 is larger than 0.5 mm. This obstacle cannot be surmounted by applying a conventional process of making the chip package. In addition, procedures of taping and de-taping not only make the process more complicated but also increase the cost.

SUMMARY OF THE INVENTION

It is therefore an object of the invention to provide a super low profile package with high efficiency of heat dissipation. The chip package possesses the small size and high efficiency of heat dissipation. Besides, the elimination of conventional procedures of taping and de-taping decrease the production cost.

The invention achieves the above-identified objects by providing a super low profile package with high efficiency of heat dissipation. The chip package includes the substrate, the heat sink, the die, the wires and the plastic mold. The substrate has a cavity. A number of the solder balls and a ground ring are seated in the bottom side of the substrate, and the extending part of the heat sink adheres to the ground ring. The die is seated in the cavity, wherein the die has a first die surface adheres to the heat sink. In addition, the die is electrically connected to the substrate by the wires, wherein the wires are bonded on the first die surface and the first substrate surface. The plastic mold encapsulates the die, the heat sink and the wires.

The invention achieves the above-identified objects by providing a process of making a super low profile package with high efficiency of heat dissipation. First, a substrate is provided while a ground ring is seated in the bottom side of the substrate, and a cavity is formed in the substrate. Second, the extending part of the heat sink adheres to the ground ring. Third, the die is seated in the cavity, and the front die surface adheres to the heat sink while parts of the front side of the die for bonding the wires are exposed. Fourth, wire bonding proceeds; two ends of the wire are separately bonded on the die and the substrate. Then, encapsulation proceeds, wherein the bottom side of the die is filled with the plastic mold. The plastic mold encapsulates the die, the heat sink and the wires. Next, the solder balls are adhered on the bottom side of the substrate.

BRIEF DESCRIPTION OF THE DRAWINGS

Other objects, features, and advantages of the invention will become apparent from the following detailed description of the preferred but non-liniting embodiments. The description is made with reference to the accompanying drawings in which.

DESCRIPTION OF THE PREFERRED EMBODIMENT

Figure 4A:
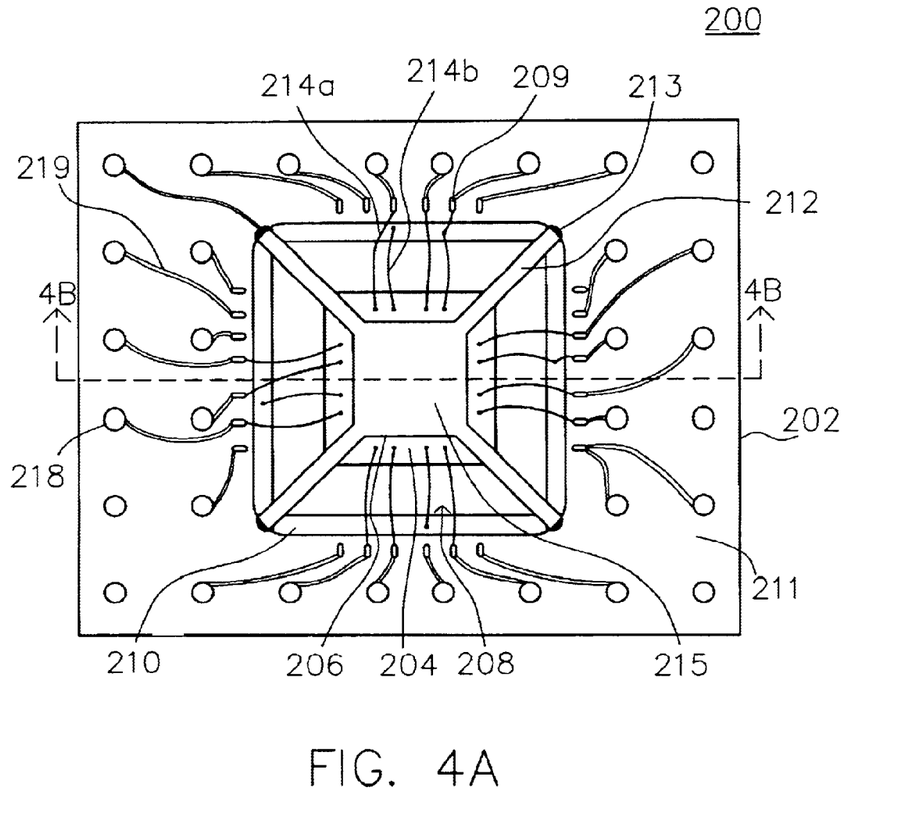
FIG. 4A show an upward view of the super low profile package with high efficiency of heat dissipation according to the invention.

Referring to FIG. 4A, which depicts an upward view of the super low profile package with high efficiency of heat dissipation according to the invention, while the plastic mold and the solder balls have not been placed in the chip package 200. In FIG. 4A, the chip package 200 includes the substrate 202, the die 204 and the heat sink 206. The die 204 is seated in the cavity 208 while the ground ring 210 is seated in the bottom side 211 of the substrate 202, and the opening of the cavity 208 is surrounded by the ground ring 210. The heat sink 206 includes the body 215 and a number of the extending parts 212, and the extending parts 212 adhere to the ground ring 210 by the Epoxy 213. However, the invention is not limited herein, and the people skilled in the art should know that the extending parts 212 could be fixed to the ground ring 210 by other skills such as soldering and welding. Multiple soldering points 209 are located around the ground ring 210, and multiple wires 214a connect the soldering points 209 and the solder ball setting points 218. Moreover, multiple wires 214b connect the die 204 and the ground ring 210, wherein the heat sink 206 is used for supporting the die 204. The objective of the invention enhancing the efficiency of heat dissipation for the chip package is achieved by the heat sink 206 exposed to the atmosphere. In addition, multiple traces 219 connect the soldering points 209 and the solder ball setting points 218, and the body 215 of the heat sink 206 is shaped for rectangular, for example.

Figure 4B:
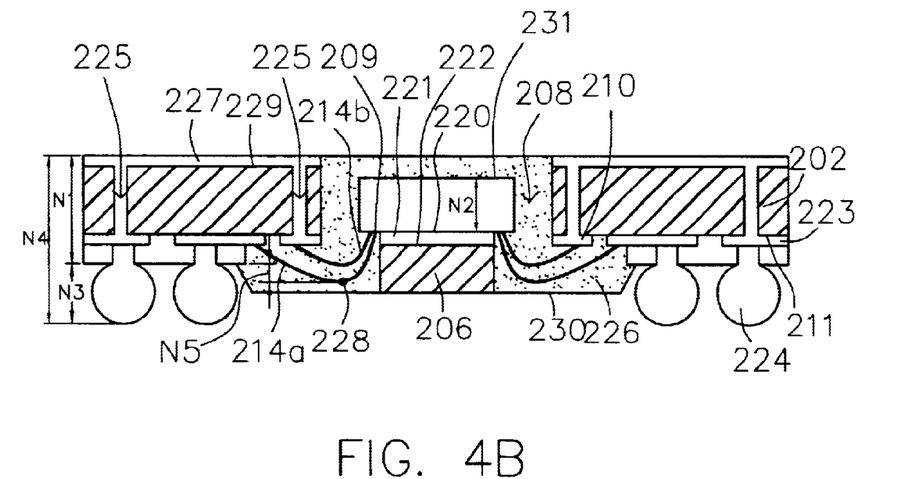
FIG. 4B shows a cross sectional view of the super low profile package along the sectional line 4B—4B in FIG. 4A.

Referring to FIG. 4B, which depicts a cross sectional view of the super low profile package along the sectional line 4B—4B in FIG. 4A, while the plastic mold 226 and the solder balls 224 have been formed in the chip package 200. The heat sink 206 is set down the cavity 208, and fixed to the substrate 202 via the extending parts (not shown in FIG. 4B). The die 204 is fixed to the bottom side 222 of the heat sink 206 by the adhesive 221, and part of the front side 220 of the die 204 are exposed for bonding the wires 214a and 214b while the solder balls 224 are seated in the bottom side 211 of the substrate 202. The height of the die 204 is smaller than the cavity 208, and the area of the heat sink 206 is smaller than the front side 220 of the die 204; therefore, the wire 214a is able to connect the front side 220 of the die 204 and the soldering point 209 of the substrate 202, and the wire 214b is connected to the ground ring 210. The cavity 208 is filled with the plastic mold 226, and the plastic mold 226 encapsulates the die 204, the heat sink 206 and the wires 214a and 214b, wherein the ground layer 227 is formed above the topside 229 of the substrate 202. The ground layer 227 is connected to the solder balls 224 by the via 225 in order to enhance the electric characteristics and decrease the signal interference. The ground layer 227 is made of tinsel such as copper. In the preferred embodiment, the bottom side 231 of the die 204 is not exposed to the atmosphere.

The bottom side 211 of the substrate 202 is further including a trace layer 223, and the trace layer 223 includes the traces 219 (shown in FIG. 4A). The ground ring 210 is connected to the ground layer 227 via the via 225. The ground layer 227 and the trace layer 223 is much thinner than the substrate 202 so that the thickness of the ground layer 227 and the trace layer 223 could be ignored; therefore, the sum of thickness of the ground layer 227, trace layer 223 and the substrate 202 is approximately equal to the substrate 202, which is represented as N1 in the preferred embodiment. The N1 is generally equal to 0.2 mm. N2 and N4 represent the thickness of the die 204 and the package 200, respectively. N3 is the height of the solder balls 224, and generally equal to 0.3 mm. The peak point of the wire 214a is higher than the wire 214b, as shown in FIG. 4B, so that the distance from the highest point 228 of the wire 214a to the bottom side 211 of the substrate 202 represents the maximum vertical distance of the wire, H5, which H5 is generally equal to 0.15 mm. The heat sink 206 is encapsulated in the plastic mold 226 and the highest point is located at the topside 230 of the plastic mold 226, wherein the height of the heat sink 206 is generally equal to 0.2 mm. All of the plastic mold 226, the wire 214a, the wire 214b and the solder balls 224 are seated in the bottom side 211 of the substrate 202, however, the thickness of the plastic mold 226, 0.2 mm, and the height of the wire 214a, 0.15 mm, are smaller than the height of the solder balls 224, 0.3 mm. Additionally, the die 204 is encapsulated in the cavity 208 of the substrate 202, so that the thickness of the die, N2, could be considered the same as or smaller than the thickness of the substrate 202, N1. According to the invention described above, the overall thickness of the chip package 200, N4, is equal to the sum of N1 and N3. In general, the thickness of the substrate 202, N1, is about 0.2 mm while the thickness of the solder balls 224, N3, is about 0.3 mm, so the overall thickness of the chip package 200 in accordance with the invention, N4, is about 0.5 mm that is thinner than the thickness of the traditional chip package 100 shown in FIG. 1B.

Figure 5:
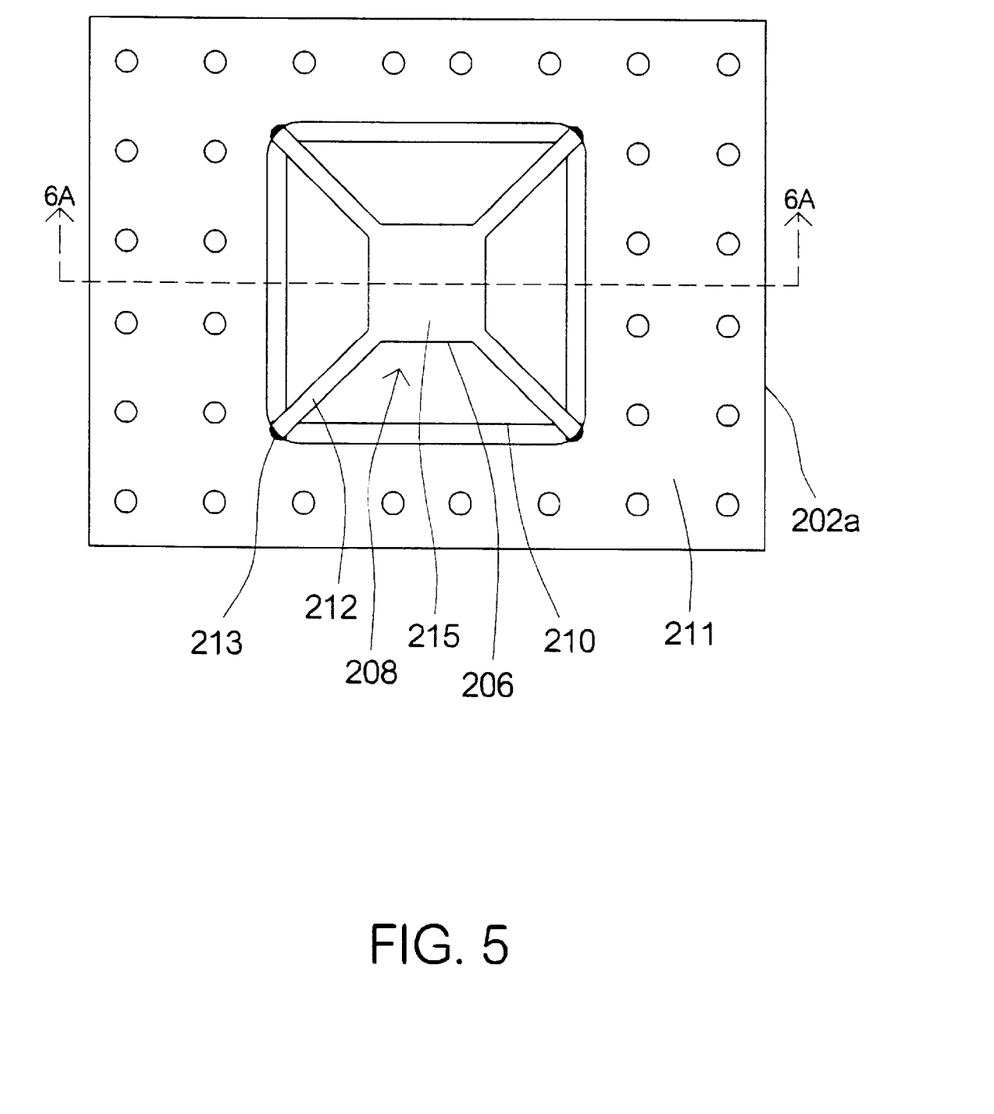
FIG. 5 shows an upward view of the chip package and the heat sink according to the invention.
Figure 6A:
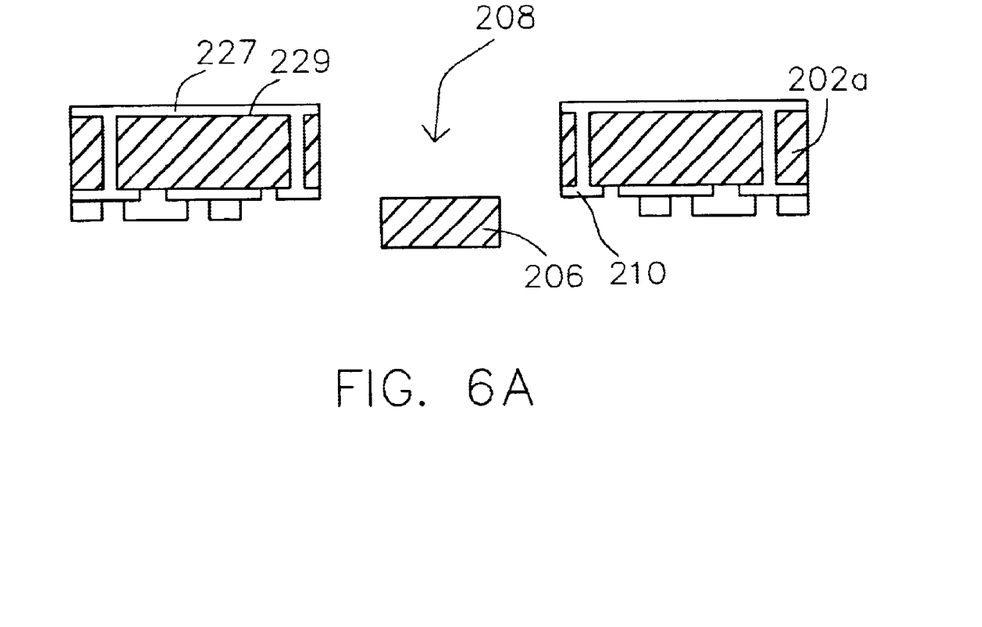
FIGS. 6A~6D shows a cross sectional view of process of making the super low profile package along the sectional line 6A—6A in FIG. 5.

The process of making the chip package according to the invention is disclosed. First, referring to FIG. 5, which depicts an upward view of the chip package and the heat sink according to the invention, the heat sink 206 and the substrate 202a with the cavity 208 are provided. The heat sink 206 includes the body 215 and a number of the extending part 212. The ground ring 210 attaches the bottom side 211 of the substrate 202a. Referring to FIGS. 6A~6D, which depict the cross sectional view of the process of making the super low profile package along the sectional line 6A—6A in FIG. 5. In FIG. 6A, the extending parts 212 of the heat sink 206 are adhered to the ground ring 210 by the Epoxy 213 in order to fix the heat sink 206 below the cavity 208, and then the ground layer 227 is formed on the topside 229 of the substrate 202a.

Figure 6B:
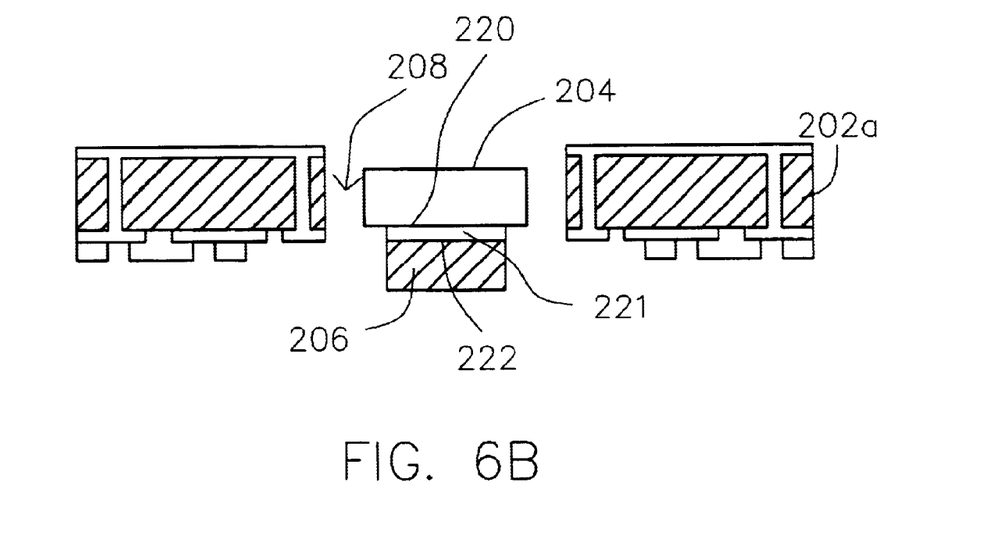

In FIG. 6B, the die 204 is turned upside down and placed into the cavity 208 of the substrate 202a. The die 204 is fixed to the bottom side 222 of the heat sink 206 by the adhesive 221, and parts of the front side of the die 220 is exposed for bonding the wires 214a and 214b.

Figure 6C:
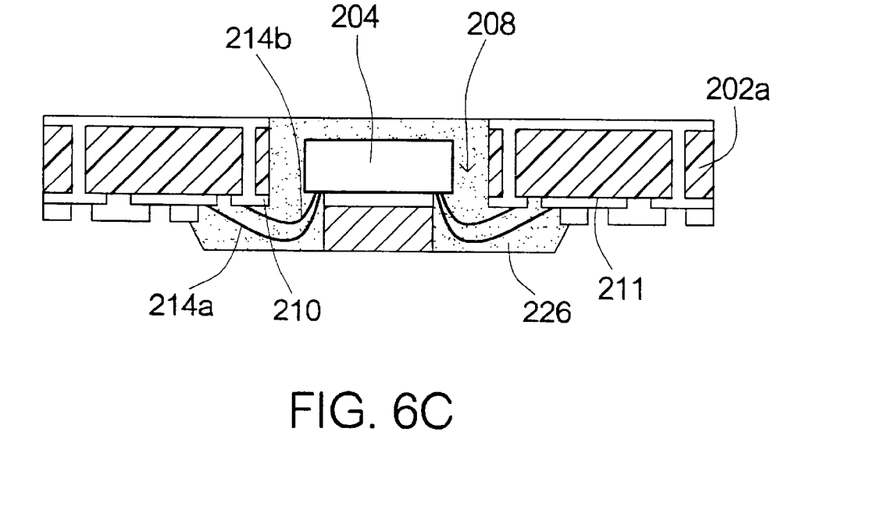

In FIG. 6C, wire bonding proceeds; the die 204 is connected to the substrate 202a via the wires 214a and 214b. Next, encapsulating proceeds; the cavity 208 is filled with the plastic mold 226, and the plastic mold 226 encapsulates the die 204, the heat sink 206, and the wires 204a and 204b.

Figure 6D:
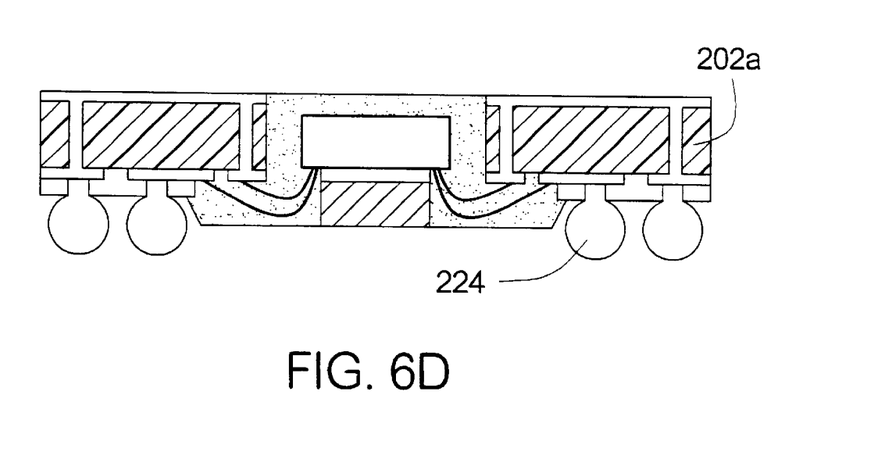

In FIG. 6D, the solder balls 224 are formed on the substrate 202a. Therefore the process of making the super low profile package according to the invention is complete, and the chip package 200 according to the invention is presented in FIG. 4B.

Figure 7:
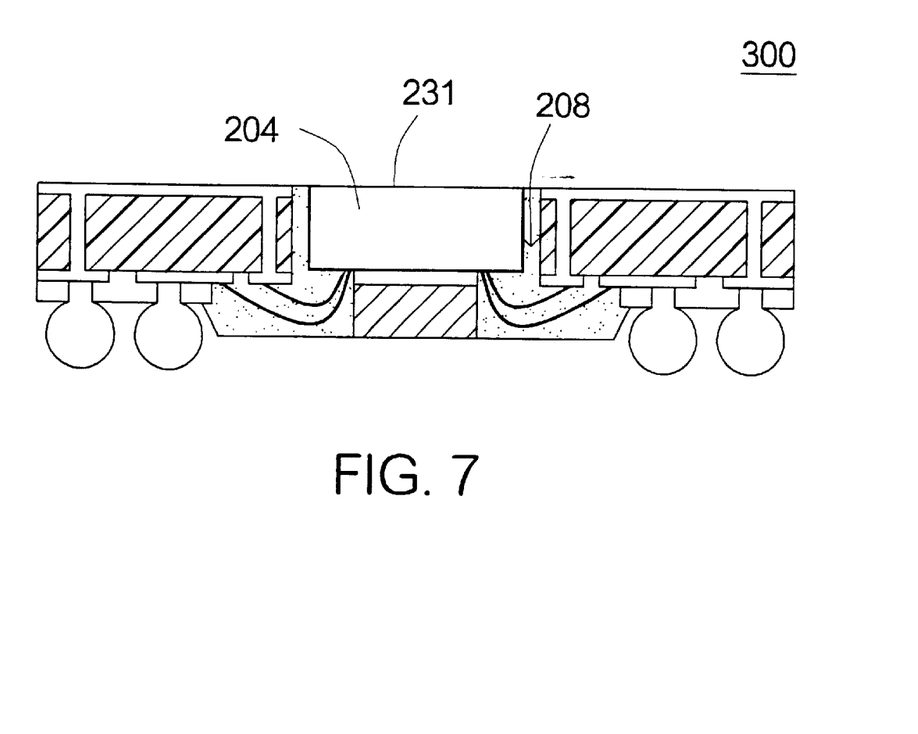
FIG. 7 shows a diagram of the super low profile package while the bottom side of the die is exposed to the atmosphere.
Figure 8:
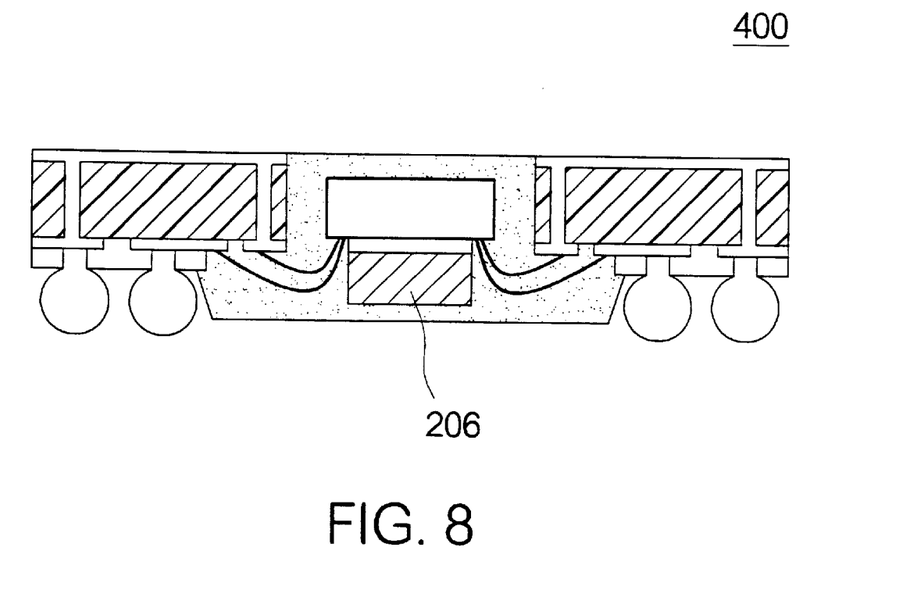
FIG. 8 shows a diagram of the super low profile package while the heat sink is not exposed to the atmosphere.

Furthermore, it is illustrated in the FIG. 4B that the bottom side 231 of the die 204 is not exposed to the atmosphere, and the size of the die 204 is smaller than the space of the cavity 208; however, the invention is not limited herein, people skilled in the art should know that the bottom side 231 of the die 204 can be exposed to atmosphere, which the height of the die 204 is equal to the depth of the cavity 208, and the size of the die 204 even can be equal to the space of the cavity 208. Referring to FIG. 7, which depicts a diagram of the super low profile package while the bottom side 231 of the die 204 is exposed to the atmosphere, and the super low profile package 300 illustrated in FIG. 7 possesses the better heat dissipation than the traditional chip package 100 illustrated in FIG. 1B. Additionally, the heat sink 206 could not be exposed to the atmosphere. Referring to FIG. 8, which depicts a diagram of the super low profile package while the heat sink is not exposed to the atmosphere, and the super low profile package 400 illustrated in FIG. 8 also possesses the better heat dissipation than the traditional chip package 100 illustrated in FIG. 1B.

According to the spirit of the invention, those skilled in the art will recognize that the body 215 of the heat sink 206 is not limited in the shape, the body 215 can be shaped for circular or grid to support the die 204, and the objective of the invention enhancing the efficiency of heat dissipation is also achieved.

Figure 9:
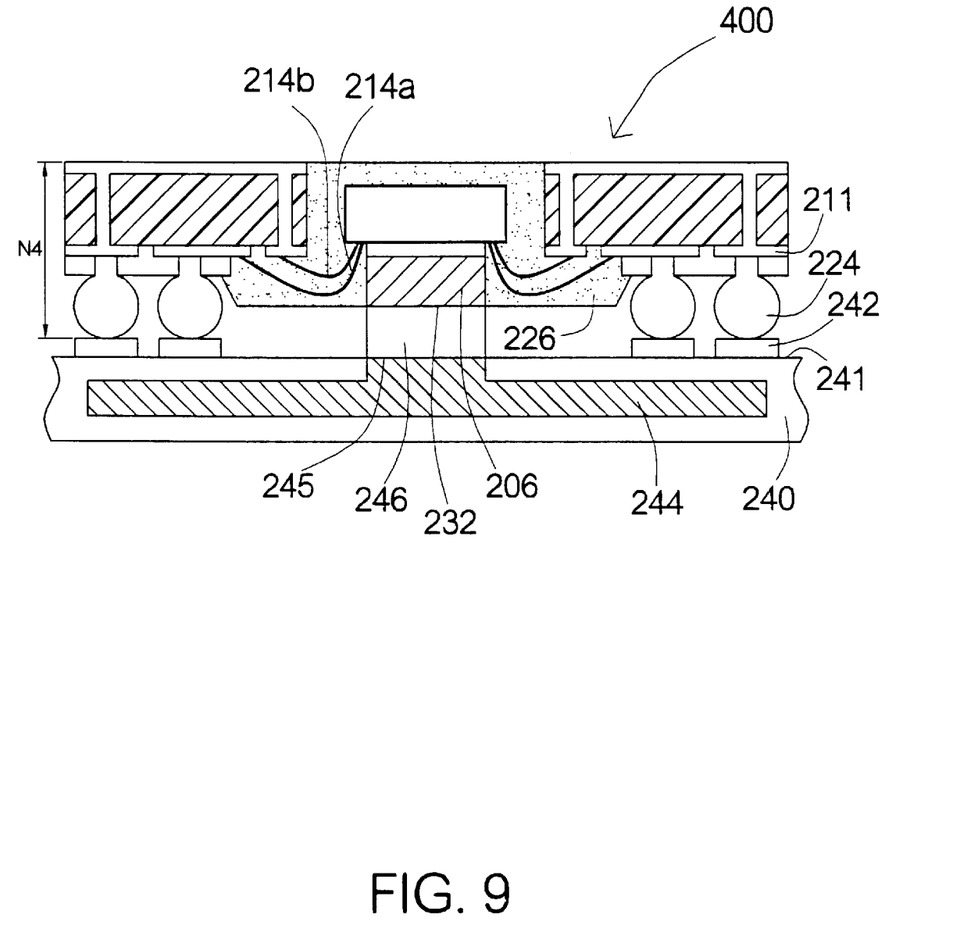
FIG. 9 shows a side view of the super low profile package in FIG. 4B connected to the printed circuit board (PCB).

Referring to FIG. 9, which depicts a side view of the super low profile package in FIG. 4B connected to the printed circuit board (PCB) 240. In FIG. 9, the chip package 200 is fixed to the PCB 240 by adhering the solder balls 224 on the bonding pad 242 of the topside 241 of the PCB 240; therefore, the chip package 200 is electrically connected to the PCB 240. The plastic mold 226, the solder balls 224, the heat sink 206, the wire 214a and the wire 214b are all seated on the bottom side 211 of the substrate 202; furthermore, the topside 232 of the heat sink 206 is fixed to the ground layer surface 245 via the solder 246 so that heat generated by the die 204 is much easier to dissipate via the heat sink 206 and the ground layer 244 of the PCB 240.

Additionally, the plastic mold, the solder balls 224, the heat sink 206, the wire 214a and the wire 214b are all seated on the bottom side 211 of the substrate 202, so that the overall thickness of the super low profile package 200, N4, is about 0.5 mm, which achieves the objective of providing a super low profile package 200. Moreover, according to the invention, the conventional procedures of taping and de-taping are eliminated from the process of making the super low profile package 200, it not only simplify the process but also decrease the production cost.

The benefits resulting from the super low profile package according to the invention include the smaller size of the chip package, the simplified process and the lower production cost achieved by eliminating taping and de-taping procedures from the traditional process. Besides, the super low profile package according to the invention further possesses the higher efficiency of heat dissipation.

While the invention has been described by ways of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A process of making a super low profile package with high efficiency of heat dissipation, comprising steps of:
   (a) providing a substrate and forming a cavity in the substrate, wherein a bottom side of the substrate includes a ground ring;
   (b) adhering and fixing an extending part of a heat sink to the ground ring;
   (c) placing a die into the cavity, and the die having a front die surface adhering to the heat sink, wherein a part of the front die surface is exposed for bonding a wire;
   (d) performing wire bonding for connecting the wire to the die and the substrate;
   (e) performing encapsulation for forming a plastic mold on a bottom substrate surface , such that the plastic mold encapsulates the die, the heat sink and the wires, and;
   (f) forming a plurality of solder balls on the bottom substrate surface.

2. The process of making a super low profile package according to claim 1,
   wherein the extending part of the heat sink adheres to the ground ring by epoxy.

3. The process of making a super low profile package according to claim 1,
   wherein the extending part of the heat sink adheres to the ground ring by solder.

4. The process of making a super low profile package according to claim 1,
   wherein the front die surface adheres to die heat sink by an adhesive.

* * * * *